United States Patent
Miyazawa et al.

(10) Patent No.: US 10,458,816 B2
(45) Date of Patent: Oct. 29, 2019

(54) SENSOR INCLUDING AN ELECTRODE, INSULATOR, PRESSURE RECEIVER, AND PRESSURE IMPARTING UNIT, AND A SYSTEM INCLUDING THE SENSOR

(71) Applicants: Hideyuki Miyazawa, Kanagawa (JP); Tsuneaki Kondoh, Kanagawa (JP); Tomoaki Sugawara, Kanagawa (JP); Yuko Arizumi, Kanagawa (JP); Junichiro Natori, Kanagawa (JP); Mayuka Araumi, Tokyo (JP); Takahiro Imai, Tokyo (JP); Makito Nakashima, Kanagawa (JP); Kimio Aoki, Shizuoka (JP); Mizuki Otagiri, Kanagawa (JP); Megumi Kitamura, Kanagawa (JP); Yuki Hoshikawa, Kanagawa (JP)

(72) Inventors: Hideyuki Miyazawa, Kanagawa (JP); Tsuneaki Kondoh, Kanagawa (JP); Tomoaki Sugawara, Kanagawa (JP); Yuko Arizumi, Kanagawa (JP); Junichiro Natori, Kanagawa (JP); Mayuka Araumi, Tokyo (JP); Takahiro Imai, Tokyo (JP); Makito Nakashima, Kanagawa (JP); Kimio Aoki, Shizuoka (JP); Mizuki Otagiri, Kanagawa (JP); Megumi Kitamura, Kanagawa (JP); Yuki Hoshikawa, Kanagawa (JP)

(73) Assignee: Ricoh Company, Ltd., Tokyo (JP)

( * ) Notice: Subject to any disclaimer, the term of this patent is extended or adjusted under 35 U.S.C. 154(b) by 50 days.

(21) Appl. No.: 15/827,049

(22) Filed: Nov. 30, 2017

(65) Prior Publication Data
US 2018/0156639 A1    Jun. 7, 2018

(30) Foreign Application Priority Data

Dec. 2, 2016   (JP) ................................. 2016-235106

(51) Int. Cl.
*G01D 5/241*    (2006.01)
*H03K 17/975*   (2006.01)
*H03K 17/96*    (2006.01)

(52) U.S. Cl.
CPC ......... *G01D 5/2417* (2013.01); *H03K 17/975* (2013.01); *H03K 17/962* (2013.01); *H03K 2217/9651* (2013.01)

(58) Field of Classification Search
CPC .... G01D 5/2417; G01D 11/00; G01D 5/2046; G01D 5/251; H03K 17/962;
(Continued)

(56) References Cited

U.S. PATENT DOCUMENTS 9,960,714 B2 *   5/2018   Kondoh ................. F03G 5/00
2013/0068038 A1 *   3/2013   Bolender ............... G01L 1/142
                                                73/862.626
(Continued)

FOREIGN PATENT DOCUMENTS

JP    2016-103967    6/2016
JP    2016-139779    8/2016

*Primary Examiner* — Vinh P Nguyen
(74) *Attorney, Agent, or Firm* — Oblon, McClelland, Maier & Neustadt, L.L.P.

(57) ABSTRACT

A sensor includes an electrode, an insulator, a pressure receiver, and a pressure imparting unit. The insulator is disposed at a position facing the electrode and away from the electrode. The pressure receiver is disposed on a surface of the insulator on a side opposite to the electrode. The pressure imparting unit presses a part of the insulator toward the electrode at a position different from the pressure receiver to contact the insulator with the electrode. The insulator gen-
(Continued)

erates power by contact charging or separation charging with respect to the electrode, to output the power as a signal.

6 Claims, 6 Drawing Sheets

(58) Field of Classification Search
CPC .................... H03K 17/975; H03K 2217/9651; G01L 1/16; G01L 5/009; G01L 1/20; G01L 1/225; G01L 9/0072; G01L 5/0004; G01L 5/0052; G01L 19/0092; G01L 19/14; G01L 1/005; G01L 17/00; G01L 1/246; G01L 23/125; G01L 27/00; G01L 5/0028; G05D 1/021; G07C 5/008; G07C 5/085

See application file for complete search history.

(56) References Cited

U.S. PATENT DOCUMENTS

| | | | |
|---|---|---|---|
| 2016/0276957 A1* | 9/2016 | Sugawara | ............... H02N 2/186 |
| 2016/0328066 A1 | 11/2016 | Kondoh et al. | |
| 2016/0336505 A1 | 11/2016 | Arizumi et al. | |
| 2016/0341381 A1 | 11/2016 | Imai et al. | |
| 2016/0344309 A1 | 11/2016 | Otagiri et al. | |
| 2017/0093305 A1 | 3/2017 | Sugawara et al. | |
| 2017/0148973 A1 | 5/2017 | Imai et al. | |
| 2017/0149357 A1 | 5/2017 | Otagiri et al. | |
| 2017/0170749 A1 | 6/2017 | Arizumi et al. | |
| 2017/0207729 A1 | 7/2017 | Kondoh et al. | |
| 2017/0214338 A1 | 7/2017 | Otagiri et al. | |
| 2017/0324023 A1 | 11/2017 | Kondoh et al. | |

* cited by examiner

SENSOR INCLUDING AN ELECTRODE, INSULATOR, PRESSURE RECEIVER, AND PRESSURE IMPARTING UNIT, AND A SYSTEM INCLUDING THE SENSOR

CROSS-REFERENCE TO RELATED APPLICATIONS

This patent application is based on and claims priority pursuant to 35 U.S.C. § 119(a) to Japanese Patent Application No. 2016-235106, filed on Dec. 2, 2016, in the Japan Patent Office, the entire disclosure of which is hereby incorporated by reference herein.

BACKGROUND

Technical Field

Aspects of the present disclosure relate to a sensor and a sensor system.

Related Art

An element in which a charge flows into an electrode at the time of performing contact and separation between the electrode and an insulator, a sensor in which the charge flowing into the electrode at the time of performing contact and separation between the electrode and the insulator is set as an electric signal source, and the like are known.

SUMMARY

In an aspect of the present disclosure, there is provided a sensor that includes an electrode, an insulator, a pressure receiver, and a pressure imparting unit. The insulator is disposed at a position facing the electrode and away from the electrode. The pressure receiver is disposed on a surface of the insulator on a side opposite to the electrode. The pressure imparting unit presses a part of the insulator toward the electrode at a position different from the pressure receiver to contact the insulator with the electrode. The insulator generates power by contact charging or separation charging with respect to the electrode, to output the power as a signal.

In another aspect of the present disclosure, there is provided a sensor system that includes the sensor and a signal processor to process a signal output from the sensor.

BRIEF DESCRIPTION OF THE SEVERAL VIEWS OF THE DRAWINGS

The aforementioned and other aspects, features, and advantages of the present disclosure would be better understood by reference to the following detailed description when considered in connection with the accompanying drawings, wherein.

Figure 1:
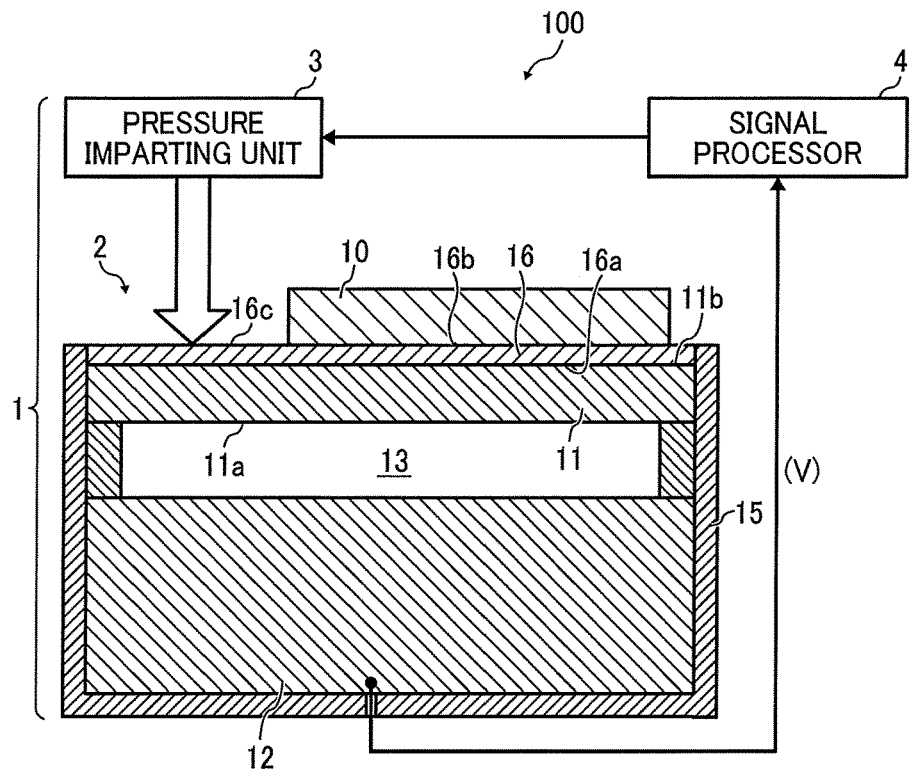
FIG. 1 is a diagram describing a configuration of a sensor unit including a sensor according to an embodiment of the present disclosure.

The accompanying drawings are intended to depict embodiments of the present disclosure and should not be interpreted to limit the scope thereof. The accompanying drawings are not to be considered as drawn to scale unless explicitly noted.

DETAILED DESCRIPTION

In describing embodiments illustrated in the drawings, specific terminology is employed for the sake of clarity. However, the disclosure of this patent specification is not intended to be limited to the specific terminology so selected and it is to be understood that each specific element includes all technical equivalents that operate in a similar manner and achieve similar results.

Although the embodiments are described with technical limitations with reference to the attached drawings, such description is not intended to limit the scope of the disclosure and all of the components or elements described in the embodiments of this disclosure are not necessarily indispensable.

Referring now to the drawings, embodiments of the present disclosure are described below. In the drawings for explaining the following embodiments, the same reference codes are allocated to elements (members or components) having the same function or shape and redundant descriptions thereof are omitted below.

Figure 2:
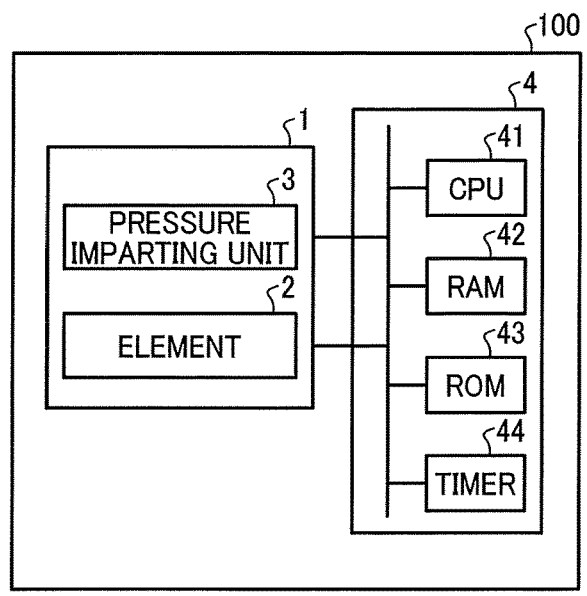
FIG. 2 is a block diagram describing the configuration of the sensor unit including the sensor according to the embodiment of the present disclosure.

Hereinafter, an embodiment according to the present disclosure will be described by using the drawings. In the embodiment, the same reference numerals are applied to the same functions or the same configurations, and the repeated description will be suitably omitted. There is a case where the drawings are partially omitted in order to help understand a partial configuration. As illustrated in FIG. 1 and FIG. 2, a sensor system 100 according to an embodiment of the present disclosure includes a sensor 1, and a signal processor 4. The sensor 1 includes an electrode 12, an insulator 11 disposed at a position facing the electrode 12 and away from the electrode 12, a pressure receiver 10 disposed on an opposite surface 11b side of the insulator 11 from the electrode 12, and a pressure imparting unit 3 to press a part of the insulator 11 toward the electrode 12 at a position different from the pressure receiver 10 to contact the insulator 11 with the electrode 12. In the sensor 1, the insulator 11 generates power by contact charging or separation charging with respect to the electrode 12 and outputs the power as a signal. In this embodiment, the element 2 is configured by laminating at least the electrode 12 and the insulator 11, and the element 2 is set as a signal output unit. In this embodiment, the sensor 1 is used as a contact and separation sensor which is used at the time of detecting a contact state or a separating state (a separated state). In the application of the sensor 1, the sensor 1 may be used other than as a contact and separation sensor.

Figure 11:
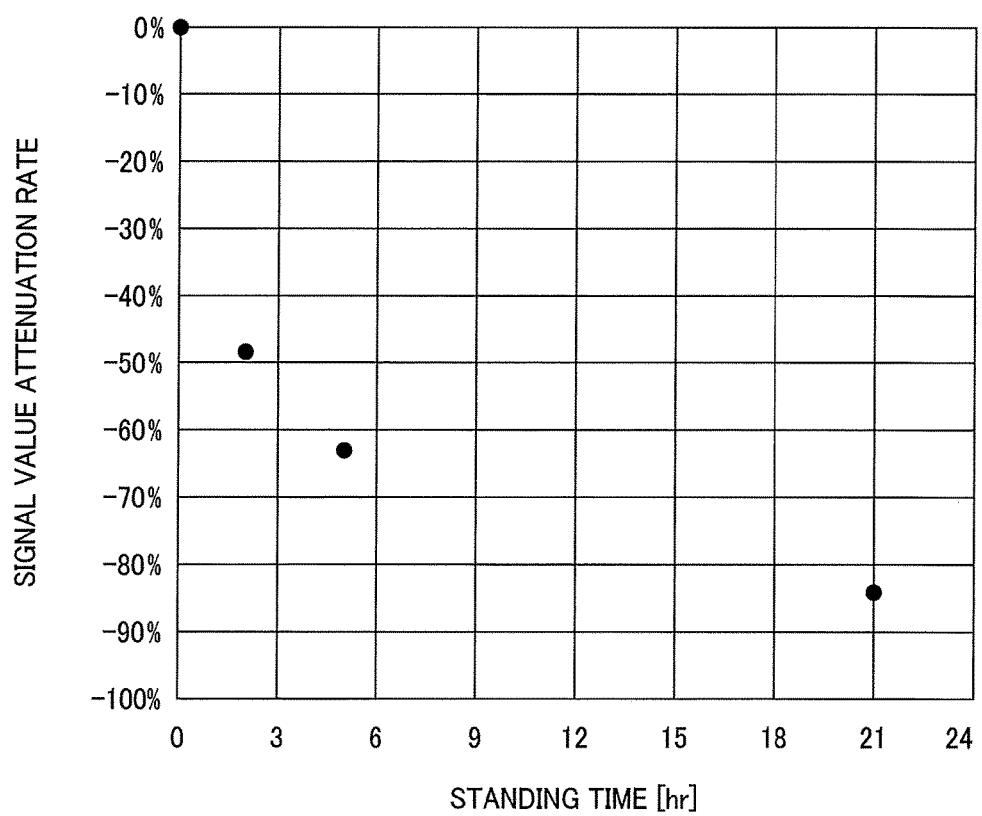
FIG. 11 is a diagram describing attenuation properties of output of a sensor of the related art when a person is in contact with or separated from the sensor.

Here, a relationship between standing time and output of a sensor of the related art is illustrated in FIG. 11. In FIG. 11, a horizontal axis represents standing time [hr], and a vertical axis represents a signal value attenuation rate [%]. It is known that the output value decreases as the standing time [hr] becomes longer in the case of a sensor having a configuration of the related art. In the case of being used as a sensor, the sensor having the configuration of the related art, provided with the element 2, has properties in which a charge on a front surface of the insulator 11 is in a state to the extent of not being capable of detecting a signal even in the case of being brought into contact with the electrode 12, before initial use or in a case where the standing time is long (longer than or equal to predetermined time). For this reason, initial rise of sensor output becomes unstable, and thus, there is a room for improvement from the viewpoint of the initial rise of the sensor. In addition, in this embodiment, a state in which output required for such detection is not obtained will be referred to as an initial state.

Figure 7:
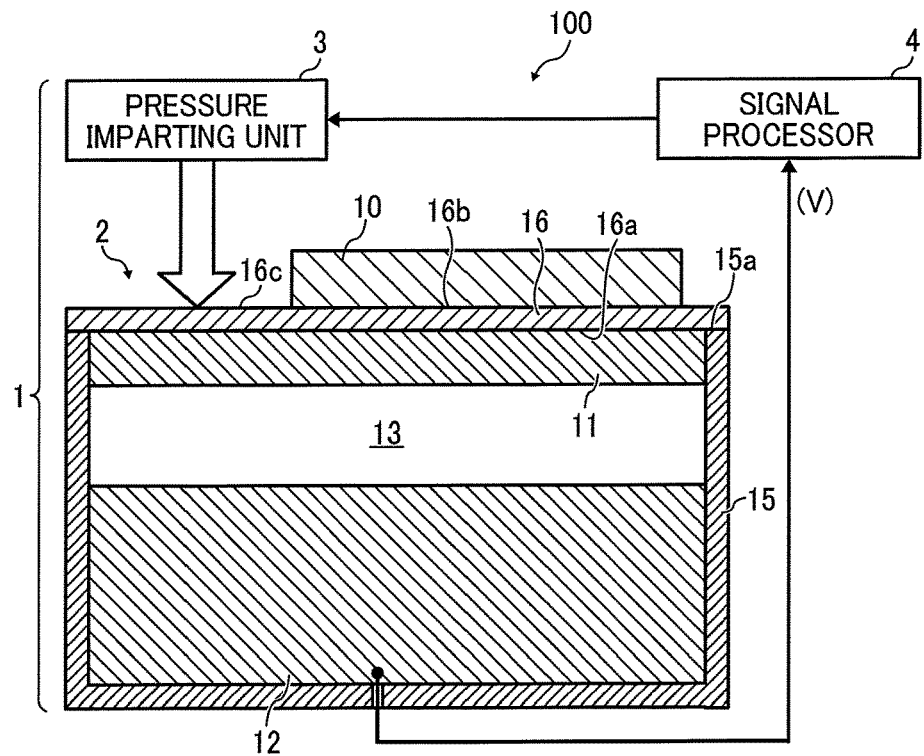
FIG. 7 is a diagram describing a modification example of the embodiment.

In order to correct a defect in such an initial state and to obtain improvement, as illustrated in FIG. 1, the sensor 1 according to this embodiment includes the pressure imparting unit 3 to press the insulator 11 toward the electrode 12 at a position 16*c* different from the pressure receiver 10 to contact the insulator 11 with the electrode 12. In this embodiment, the element 2 includes a configuration member such as the insulator 11, the electrode 12, a space 13, a spacer 14, and a cover 15 (also referred to as a case). Other members may further provided as the configuration of the element 2, as required. The insulator 11, the electrode 12, the space 13, and the spacer 14 are included in the cover 15. In this embodiment, the electrode 12 is contained in the bottomed cover 15. The space 13 is formed by disposing the spacer 14 having insulating properties on the electrode 12, and by supporting a lid 16 of the cover 15, on which the insulator 11 is mounted, by the spacer 14. The spacer 14 may be disposed as needed, and for example, as illustrated in FIG. 7, in a case where the lid 16 is disposed on an opening edge part 15*a* of the cover 15 and is supported by the opening edge part 15*a*, the spacer 14 may not be disposed. In this embodiment, the lid 16 has flexibility, and can be modified by receiving a pressure. Similarly, the insulator 11 also has flexibility, and is mounted by bringing the opposite surface 11*b* into the inner surface 16*a* which is a surface positioned on the space 13 side of the lid 16. The space 13 is configured as a space sealed in a state the lid 16 is mounted on the spacer 14. For this reason, it is preferable that a seal member is disposed in a contact portion between the lid 16 and the spacer 14.

Figure 4:
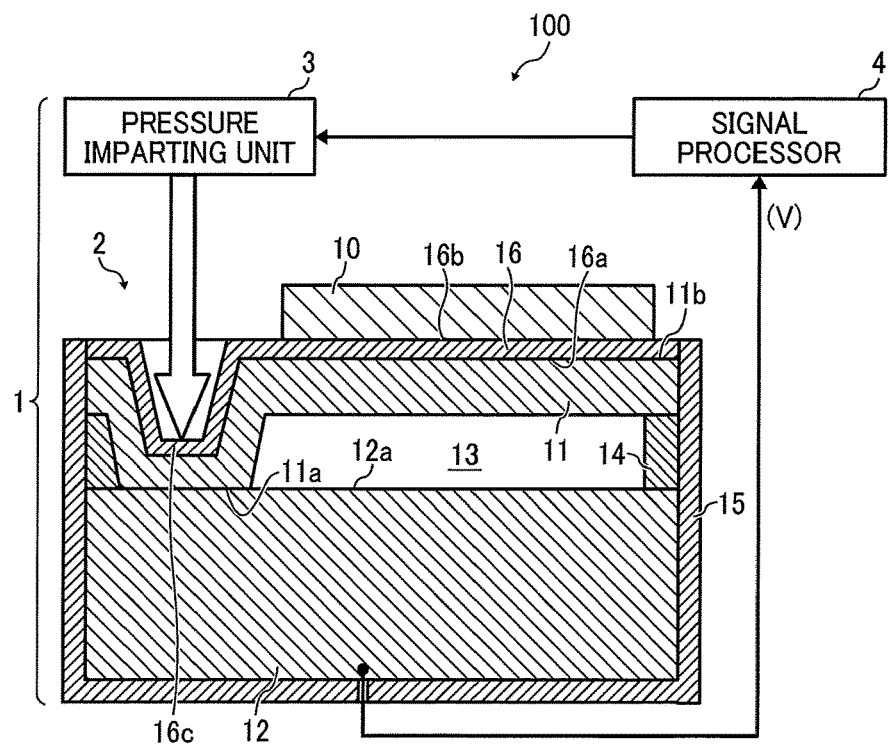
FIG. 4 is a diagram describing state of an element to which a pressure is imparted by a pressure imparting unit in an initial state.

In this embodiment, the pressure receiver 10 is a contact detector, is disposed on an outer surface 16*b* of the lid 16, and has a positional relationship in which the pressure receiver 10 faces the insulator 11 through the lid 16. Here, the pressure receiver 10 is disposed on the lid 16, and is integrated with the element 2, but may be disposed to have a gap with respect to the outer surface 16*b* of the lid 16, and may be separated from the element 2. The pressure receiver 10 is a portion in which the electrode 12 is in contact with the insulator 11 in FIG. 1, and is disposed in a region separated from the position 16*c* with which the electrode 12 and the insulator 11 are in contact by the pressure imparting unit 3. Contact and separation of a person or an object other than in the initial state is detected from the contact state and the separating state with respect to the pressure receiver 10. The pressure imparting unit 3 is disposed on the outside of the lid 16 to be shifted from the pressure receiver 10, and presses the lid 16 against the electrode 12, and thus, sets the insulator 11 and the electrode 12 in the separated state to be in the contact state at the time of not being pressed. The pressure imparting unit 3, for example, includes a movable body such as a weight disposed to be capable of contacting the outer surface 16*b* of the lid 16, and an electromagnetic actuator retaining the movable body. The movable body is retained in a state where the insulator 11 is separated from the electrode 12 when the electromagnetic actuator is in an off state, and in a case where the electromagnetic actuator is turned on [operation], as illustrated in FIG. 4, the movable body drops under the own weight to deform the insulator 11 towards the electrode 12 through the lid 16. Thus, the movable body is moved such that the insulator 11 and the electrode 12 (more specifically, a front surface 12*a*) are in the contact state.

As illustrated in FIG. 1, the signal processor 4 is connected to the electrode 12 of the element 2 (the sensor 1) through a signal line, and has a function of performing determination of contact and separation according to a signal output from the electrode 12 [for example, output]. For example, the determination of contact and separation is performed from a voltage output from the electrode 12 of the element 2 (an output voltage V) and threshold values V1 and V2. The signal processor 4 has a function of operating the pressure imparting unit 3 in a case where elapsed time H is longer than predetermined time H1. That is, as illustrated in FIG. 2, the signal processor 4 includes a central processing unit (CPU) 41, which is a central operator, a random access memory (RAM) 42 and a read-only memory (ROM) 43, which are a storage, and a timer 44, which is a time measurement unit. The threshold values V1 and V2 at the time of performing the determination of contact and separation, and the predetermined time H1 as a determination value used for determining whether or not the sensor 1 is in the initial state are stored in advance in the ROM 43. The threshold value V1 can also be used as a determination value used for determining whether or not the sensor 1 is in the initial state. The CPU 41 has a function of measuring the elapsed time H from when the output voltage V is output from the electrode 12 (the sensor 1) to when the next output voltage V is output by the timer 44. The CPU 41 has a function of performing determination of contact based on the output voltage V and the threshold value V1 from the electrode 12, a function of performing determination of separation based on the output voltage V and the threshold value V2, and a function of controlling the operation of the pressure imparting unit 3 [ON and OFF of the electromagnetic actuator] based on the elapsed time H and the predetermined time H1 which are measured by the timer 44.

Figure 3:
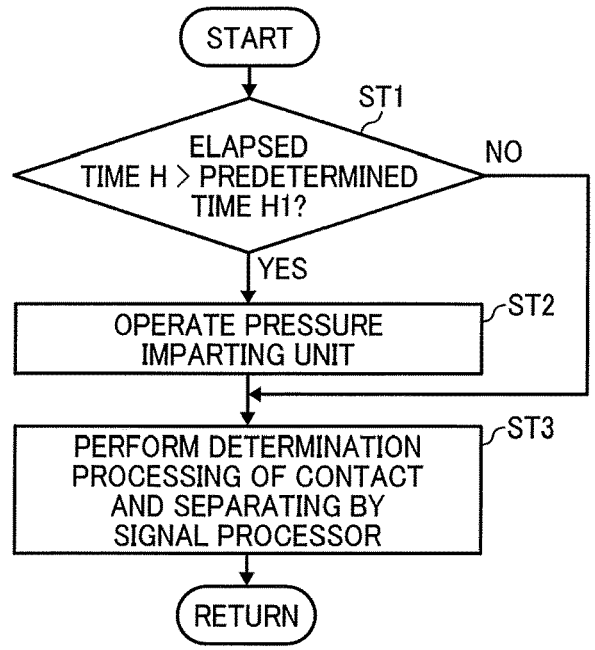
FIG. 3 is a flowchart illustrating an aspect of control according to this embodiment.

Control contents of the sensor system 100 having such a configuration will be described according to a flowchart illustrated in FIG. 3. In Step ST1, the sensor system 100 determines whether or not it is the initial state, for example, by the signal processor 4 from the elapsed time H and the predetermined time H1 obtained from the previous sensor operation. The signal processor 4 measures the elapsed time H after the output voltage V from the sensor 1 disappears by the timer 44. In a case where the elapsed time H longer than the predetermined time H1, the signal processor 4 considers that it is an output level in which the output voltage V from the element 2 (the sensor 1) is low, and the determination of contact and separation is not capable of being performed, and proceeds to Step ST2, and in a case where the elapsed time H is not longer than the predetermined time H1, the signal processor 4 considers that it is an output level in which the determination of contact and separation is capable of being performed, and proceeds to Step ST3.

Figure 5:
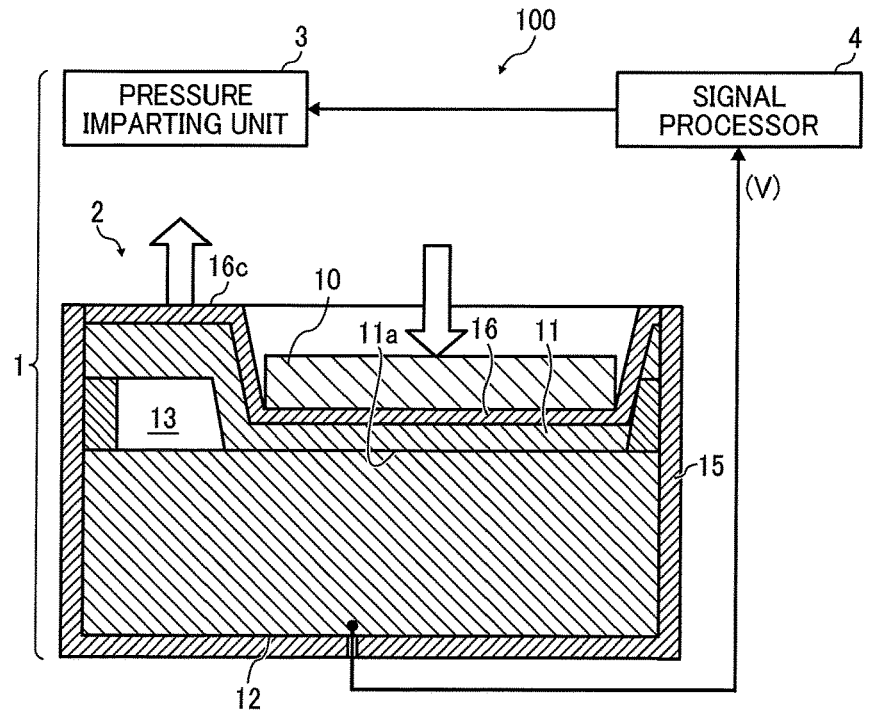
FIG. 5 is a diagram describing state of the element when a detection target is in contact with the sensor after a pressure is imparted by the pressure imparting unit.

In Step ST2, the signal processor 4 operates the pressure imparting unit 3, and proceeds to Step ST3. In Step ST2, for example, the electromagnetic actuator is operated, and the movable body drops under the own weight, and thus, the insulator 11 is deformed as illustrated in FIG. 4, and the front surface 12a of the electrode 12 and the facing surface 11a of the front surface 12a of the electrode 12 are in the contact state. In such a state, in a case where a person or an object is in contact with the pressure receiver 10, and is pressed, and thus, the insulator 11 is deformed towards the electrode 12, an internal pressure of the space 13 increases. Accordingly, the insulator 11 which is in the contact state along with the front surface 12a of the electrode 12 by the movable body, and as illustrated in FIG. 5, is pushed up along with the movable body in a direction separated from the front surface 12a of the electrode 12. As a result thereof, the insulator 11 is separated from the front surface 12a of the electrode 12, and at this time, a charge generated by separation charging is applied to the electrode 12, and thus, is output as the output voltage V. On the other hand, in Step ST1, in a case where the elapsed time H is not longer than the predetermined time H1, the signal processor 4 considers that it is an output level in which the determination of contact and separation is capable of being performed, and proceeds to Step ST3.

Figure 6:
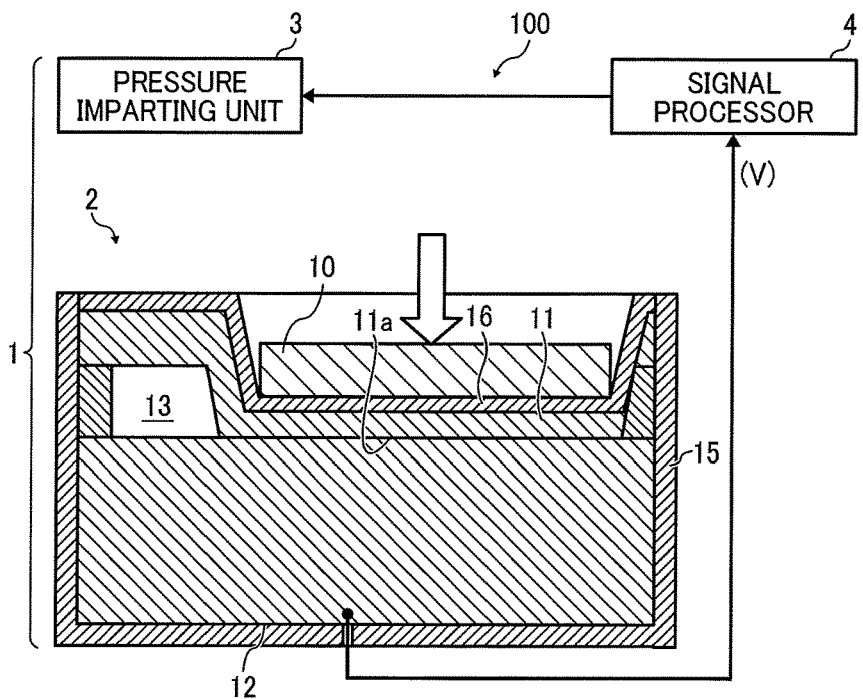
FIG. 6 is a diagram describing the state of the sensor when the detection target is in contact with the sensor in a normal state.

In Step ST3, the signal processor 4 determines whether or not the pressure receiver 10 is pressed. Here, in a case where a person or an object is pressed in contact with the pressure receiver 10, and as illustrated in FIG. 6, the insulator 11 is deformed in a direction in contact with the electrode 12, and is in contact with the front surface 12a of the electrode 12 and the facing surface 11a. At this time, the element 2 is not in the initial state, and thus, a charge remaining on the facing surface 11a of the insulator 11 is moved to the electrode 12, and is output to the signal processor 4 as the sensor output (the output voltage V). In the signal processor 4, the output voltage is compared with the threshold value V1, and thus, in a case where the output voltage is greater than the threshold value V, it is determined as the contact state. In a case where a person or an object is separated from the pressure receiver 10, as illustrated in FIG. 1, the insulator 11 is separated from the front surface 12a of the electrode 12. At this time, a charge generated by separation charging is applied to the electrode 12, and thus, is output to the signal processor 4 as the sensor output (the output voltage V). In the signal processor 4, the output voltage is compared with the threshold value V2, and in a case where the output voltage V is greater than the threshold value V2, it is determined as the separating state. That is, in a case where there is the output voltage V greater than the threshold values V1 and V2, the signal processor 4 is capable of detecting that it is in the contact and separation state and the separated state.

Thus, the facing surface 11a, which is a part of the insulator 11, is partially in the contact state with the front surface 12a of the electrode 12 by the pressure imparting unit 3. Thus, in a case where a pressure is received by the pressure receiver 10, and the insulator 11 is deformed towards the electrode 12, the facing surface 11a of the insulator 11 in contact with the electrode 12 is separated from the front surface 12a of the electrode 12, and separating discharge occurs, and thus, initial rise of initial output from the sensor 1 can be improved. In addition, even in a case where a pressure is applied to the insulator 11 through the lid 16 by being in contact with a person or an object or by the pressure imparting unit 3, and a pressure in the space 13 increases, the element 2 is not broken due to elastic deformation or the like of the insulator 11 or the spacer 14.

In the embodiment described above, the sensor 1 determines whether or not it is in the initial state by comparing the elapsed time H with the predetermined time H1, but in the case of output voltage V<threshold value by comparing the output voltage V with an arbitrary threshold value as the determination value, it may be determined such that it is considered as the output level in which the output voltage V from the element 2 (the sensor 1) is low, and the determination of contact and separation is not capable of being performed. In this case, for example, the threshold value V1 or the threshold value V2 may be used as the arbitrary threshold value (the determination value).

Next, the details of the members configuring the element 2 will be described.

<Insulator 11>

The material of the insulator 11 is not particularly limited, but can be suitably selected according to the object. Here, a material having excellent charging properties at the time of being separated from the electrode 12 is preferable in order to improve S/N of an output signal. In addition, in consideration of durability and deformation properties according to the contact with a person or an object, a rubber material is preferable. For example, the insulator 11 is formed of a silicone rubber composition containing silicone rubber.

—Silicone Rubber—

The silicone rubber is not particularly limited insofar as the silicone rubber is rubber having an organopolysiloxane bond, but can be suitably selected according to the object. Examples of the silicone rubber include dimethyl silicone rubber, methyl phenyl silicone rubber, modified silicone rubber (for example, alkali modified silicone rubber, alkyd modified silicone rubber, ester modified silicone rubber, epoxy modified silicone rubber, and the like), and the like. Only one type of the silicone rubber may be independently used, or two or more types thereof may be used together. Silicone rubber which is suitably synthesized may be used, or a commercially available product may be used, as the silicone rubber. Examples of the commercially available product include IVS4312, TSE3033, and XE14-C2042 (manufactured by Momentive Performance Materials Inc.), KE-1935 (manufactured by Shin-Etsu Chemical Co., Ltd.), DY35-2083 (manufactured by Dow Corning Toray Co., Ltd.), and the like. Only one type of the commercially available product may be independently used, or two or more types thereof may be used together.

—Preparation of Silicone Rubber Composition—

The silicone rubber composition can be prepared by mixing the silicone rubber, a filler, and other components as required, and by kneading and dispersing the mixture.

—Forming Method of Silicone Rubber—

A forming method of the silicone rubber is not particularly limited, but can be suitably selected according to the object, and examples of the forming method include a method in which the silicone rubber composition is applied onto a base material by blade coating, die coating, dip coating, and the like, and then, is cured by heat, an electron beam, or the like. The silicone rubber may be a single layer, or may be a multilayer. An average thickness of the silicone rubber is not particularly limited, but can be suitably selected according to the object, and in consideration of mechanical strength or flexibility, the average thickness is preferably 1 μm to 10 mm, and is more preferably 20 μm to 200 μm. It is preferable to have volume resistivity of greater than or equal to 108 Ωcm, and it is more preferable to have volume resistivity of greater than or equal to 1010 Ωcm, as electric properties of the silicone rubber. By setting the volume resistivity of the insulator to be in a suitable numerical range, a charge easily remains on pre-silicone rubber even in a case where the standing time is long.

—Surface Modification Treatment of Insulator 11—

It is preferable that the insulator 11 is subjected to surface modification treatment from the viewpoint of improving the charging properties. The surface modification treatment is not particularly limited insofar as a certain level of irradiate energy is obtained, and a material can be modified, but can be suitably selected according to the object, and examples of the surface modification treatment include plasma treatment, corona discharge treatment, electron beam irradiation treatment, ultraviolet ray irradiation treatment, ozone treatment, radioactive ray (an X ray, an α ray, a β ray, a γ ray, neutron ray) irradiation treatment, and the like. Among them, the plasma treatment, the corona discharge treatment, and the electron beam irradiation treatment are preferable from the viewpoint of a treatment speed.

——Plasma Treatment——

In the case of the plasma treatment, for example, an atmospheric plasma device can also be used as a plasma generator in addition to a parallel flat plate type plasma device, a capacitive coupling type plasma device, and an inductive coupling type plasma device. Low-pressure plasma treatment is preferable from the viewpoint of durability. In the plasma treatment, a reaction pressure is not particularly limited, but can be suitably selected according to the object, and the reaction pressure is preferably 0.05 Pa to 100 Pa, and is more preferably 1 Pa to 20 Pa. In the plasma treatment, a reaction atmosphere is not particularly limited, but can be suitably selected according to the object, and for example, gas such as inert gas, rare gas, and oxygen is effective. In the plasma treatment, the amount of irradiation power is defined by (Output×Irradiation Time). The amount of irradiation power is preferably 5 Wh to 200 Wh, and is more preferably 10 Wh to 50 Wh. In a case where the amount of irradiation power is in a suitable range, the charging properties of the insulator 11 can be improved, and durability does not decrease due to excessive irradiation.

——Corona Discharge Treatment——

In the corona discharge treatment, applied energy (integrated energy) is preferably 6 J/cm$^2$ to 300 J/cm$^2$, and is more preferably 12 J/cm$^2$ to 60 J/cm$^2$. In a case where the applied energy is in a suitable range, excellent charging performance and durability can be attained. In the corona discharge treatment, an applied voltage is preferably 50 V to 150 V, and is more preferably 100 V. Air is preferable as a reaction atmosphere of the corona discharge treatment.

——Electron Beam Irradiation Treatment——

In the electron beam irradiation treatment, irradiation dose is preferably greater than or equal to 1 kGy, and is more preferably 300 kGy to 10 MGy. In a case where the irradiation dose is in a suitable range, the charging properties of the insulator 11 can be improved, and the durability does not decrease due to excessive irradiation. In the electron beam irradiation treatment, a reaction atmosphere is not particularly limited, but can be suitably selected according to the object.

——Ultraviolet Ray Irradiation Treatment——

In the ultraviolet ray irradiation treatment, an ultraviolet ray is preferably greater than or equal to 200 nm at a wavelength of less than or equal to 365 nm, and is more preferably greater than or equal to 240 nm at a wavelength of less than or equal to 320 nm. In the ultraviolet ray irradiation treatment, an integrated light amount is preferably 5 J/cm$^2$ to 500 J/cm$^2$, and is more preferably 50 J/cm$^2$ to 400 J/cm$^2$. In a case where the integrated light amount is in a suitable range, the charging properties of the insulator can be improved, and the durability does not decrease due to excessive irradiation. In the ultraviolet ray irradiation treatment, a reaction atmosphere is not particularly limited, but can be suitably selected according to the object.

<Electrode>

The material, the shape, the size, and the structure of the electrode 12 are not particularly limited, but can be suitably selected according to the object. Examples of the material of the electrode 12 include metal, a carbon-based conductive material, a conductive rubber composition, and the like. Examples of the metal include gold, silver, copper, iron, aluminum, stainless steel, tantalum, nickel, phosphor bronze, and the like. Examples of the carbon-based conductive material include graphite, a carbon fiber, a carbon nanotube, and the like. Examples of the conductive rubber composition include a conductive filler, a composition containing rubber, and the like. Examples of the conductive filler include a carbon material (for example, Ketjen black, acetylene black, graphite, a carbon fiber, a carbon fiber (CF), a carbon nanofiber (CNF), a carbon nanotube (CNT), and the like), a metal filler (for example, gold, silver, platinum, copper, iron, aluminum, nickel, and the like), a conductive polymer material (for example, a derivative any one of polythiophene, polyacetylene, polyaniline, polypyrrole, polyparaphenylene, and polyparaphenylene vinylene, a material obtained by adding a dopant represented as an anion or a cation to the derivative, or the like), an ionic liquid, and the like. Only one type of the conductive filler may be independently used, or two or more types thereof may be used together. Examples of the rubber include silicone rubber, modified silicone rubber, alkali rubber, chloroprene rubber, polysulfide rubber, urethane rubber, isobutyl rubber, fluorosilicone rubber, ethylene rubber, natural rubber (latex), and the like. Only one type of the rubber may be independently used, or two or more types thereof may be used together.

Examples of an aspect of the electrode 12 include a sheet, a film, a thin film, a woven fabric, a non-woven fabric, a mesh, a sponge, and the like. Furthermore, a non-woven fabric formed by stacking the fiber-like carbon material may be used. The shape of the electrode 12 is not particularly limited, but can be suitably selected according to the shape of the element 2 (the sensor 1). The size of the electrode 12 is not particularly limited, but can be suitably selected according to the size of the element 2 (the sensor 1). An average thickness of the electrode 12 can be suitably selected according to the structure of the element 2 (the sensor 1), and is preferably 0.01 μm to 1 mm, and is more preferably 0.1 μm to 500 μm, from the viewpoint of conductivity and flexibility. In a case where the average thickness is greater than or equal to 0.01 μm, the mechanical strength is suitable, and the conductivity is improved.

<Space>

A fluid existing in the space 13 is not particularly limited, but can be suitably selected according to the object, and gas such as air is preferable.

<Spacer>

The material, the aspect, the shape, the size, and the like of the spacer 14 are not particularly limited, but can be suitably selected according to the object. Examples of the material of the spacer 14 include a polymer material, rubber, a metal, a conductive polymer material, a conductive rubber composition, and the like. Examples of the polymer material include polyethylene, polypropylene, polyethylene terephthalate, polyvinyl chloride, a polyimide resin, a fluorine resin, an alkali resin, and the like. Examples of the rubber include silicone rubber, modified silicone rubber, alkali rubber, chloroprene rubber, polysulfide rubber, urethane rubber, isobutyl rubber, fluorosilicone rubber, ethylene rubber, natural rubber (latex), and the like. Examples of the metal include gold, silver, copper, aluminum, stainless steel, tantalum, nickel, phosphor bronze, and the like. Examples of the conductive polymer material include polythiophene, polyacetylene, polyaniline, and the like. Examples of the conductive rubber composition include a conductive filler, a composition containing rubber, and the like. Examples of the conductive filler include a carbon material (for example, Ketjen black, acetylene black, graphite, a carbon fiber, a carbon fiber, a carbon nanofiber, a carbon nanotube, and the like), a metal (for example, gold, silver, platinum, copper, iron, aluminum, nickel, and the like), a conductive polymer material (for example, a derivative of any one of polythiophene, polyacetylene, polyaniline, polypyrrole, polyparaphenylene, and polyparaphenylene vinylene, a material obtained by adding a dopant represented as an anion or a cation to the derivative, or the like), an ionic liquid, and the like. Examples of the rubber include silicone rubber, modified silicone rubber, alkali rubber, chloroprene rubber, polysulfide rubber, urethane rubber, isobutyl rubber, fluorosilicone rubber, ethylene rubber, natural rubber (latex), and the like. Examples of the aspect of the spacer include a sheet, a film, a woven fabric, a non-woven fabric, a mesh, a sponge, and the like. The shape, the size, the thickness, and the disposition location of the spacer can be suitably selected according to the structure of the element 2 (the sensor 1).

<Cover and Lid>

The cover 15 and the lid 16 are not particularly limited, but can be suitably selected according to the object. Examples of the material of the cover 15 and the lid 16 include a polymer material, rubber, and the like. Examples of the polymer material include polyethylene, polypropylene, polyethylene terephthalate, polyvinyl chloride, a polyimide resin, a fluorine resin, an alkali resin, and the like. Examples of the rubber include silicone rubber, modified silicone rubber, alkali rubber, chloroprene rubber, polysulfide rubber, urethane rubber, isobutyl rubber, fluorosilicone rubber, ethylene rubber, natural rubber (latex), and the like. The configuration, the shape, the size, the thickness, and the like of the cover 15 and the lid 16 are not particularly limited, but can be suitably selected according to the device.

<Pressure Imparting Unit>

The pressure imparting unit 3 is not particularly limited insofar as the insulator 11 and the electrode 12 in a portion other than the pressure receiver 10 (the contact detector) (the position 16c different from the pressure receiver 10) can be in the contact state. Examples of the pressure imparting unit 3 include the followings.

A weight, which is a movable body, may be disposed as the pressure imparting unit.

The electrode 12 and the insulator 11 (the element 2) may be interposed from a lamination direction in a clip-like structure. Here, a pressure to be applied by the pressure imparting unit 3 should be greater than or equal to a pressure in which the electrode 12 and the insulator 11 can be in the contact state only in a desired region, and be less than or equal to a level of separating the insulator 11 from the electrode 12 due to an increase in a pressure in the space 13, which is generated when a person or an object is in contact with the pressure receiver 10.

A spring-like structure may be provided between the insulator 11 and the cover 15 (the lid 16).

A swingable arm-like (seesaw-like) structure, in which a weight is disposed on one end, may be disposed on the cover 15 or the lid 16.

A material swelling according to heat or light may be disposed between the insulator 11 and the cover 15 (the lid 16).

A magnet (also including an electromagnet) may be disposed between the insulator 11 and the cover 15 (the lid 16).

Compressed gas may be provided between the insulator 11 and the cover 15 (the lid 16).

An air suction machine may be disposed, and thus, the position 16c different from the pressure receiver 10 may be sucked.

<Signal Processor>

Figure 8:
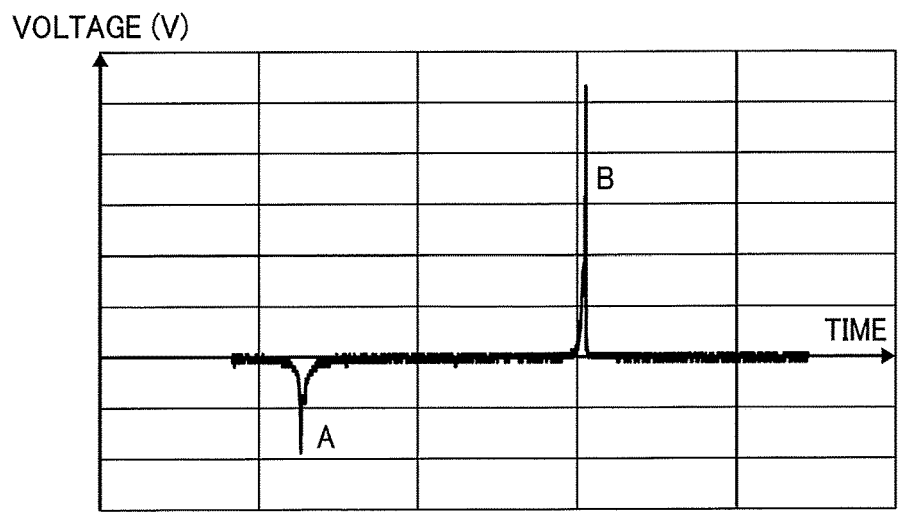
FIG. 8 is a diagram illustrating an example of output from the sensor when a contact and separation operation is performed with respect to the sensor.

As described above, the signal processor 4 is connected to the electrode 12 of the element 2, and the determination of contact and separation is performed according to the signal to be output. FIG. 8 illustrates a waveform of a voltage to be output by the operation of contact and separation in a case where the sensor 1 is not in the initial state (in a normal case). In FIG. 8, a waveform generated at the time of performing contact is represented by A, and a waveform generated at the time of performing separation is represented by B. The maximum value (the voltage) of such waveforms A and B is obtained in advance for each sensor 1 in a test or the like, and is stored in the ROM 43 configuring the signal processor 4 as threshold values A and B, and the CPU 41 compares the output voltage V with each of the threshold values stored in the ROM 43 in Step ST3 of FIG. 5, and determines the state of contact and separation. The positivity and the negativity of the signal, for example, can be changed by a combination of the electrode 12 and the insulator 11, a surface treatment, connection of a circuit, or the like.

<Other Members>

Examples of other members include an electric wire, an electric circuit, and the like.

—Electric Wire—

The electric wire is not particularly limited, but can be suitably selected according to the object. Examples of the material of the electric wire include a metal, an alloy, and the like. Examples of the metal include gold, silver, copper, aluminum, nickel, and the like. The configuration, the shape, the size, and the like of the electric wire are not particularly limited, but can be suitably selected according to the device.

—Electric Circuit—

The electric circuit is not particularly limited insofar as the electric circuit is a circuit taking out a change generated in the element 2 as power, but can be suitably selected according to the object. Examples of the electric circuit include a rectification circuit, an oscilloscope, a voltmeter, an ammeter, a storage circuit, a light-emitting diode (LED), various sensors (an ultrasonic sensor, a pressure sensor, a tactile sensor, a strain sensor, an acceleration sensor, a shock sensor, a vibration sensor, a pressure sensor, an electric field sensor, a sound pressure Sensor, and the like), and the like. Furthermore, it should be noted that the configuration of the sensor system 100 in the embodiment described above is an example, and there are various system configuration examples according to the application or the object. As described above, the embodiment of the present disclosure has been described, but the present disclosure is not limited to the specific embodiment, and includes various modifications and changes within the scope of the gist of the present disclosure described in the range of claims. In addition, a part or all of the embodiment described above can be combined.

In the embodiment described above, the reason that contact in the initial state of the sensor 1 can be detected has been described. For example, in a case where it is considered that the use of the sensor 1 (also referred to as a sensor unit) is ended, and the initial state is maintained until the next contact of a person or an object, as illustrated in FIG. 4, a part of the facing surface 11a of the insulator 11 by the pressure imparting unit 3 and the front surface 12a of the electrode 12 is in a partial contact state. In such a state, in a case where a person or an object is in contact with the pressure receiver 10 of the element 2, the insulator 11 and the lid 16 of the cover 15 are deformed, and according to the case, the cover 15 is also deformed. In addition, the fluid in the space 13 of the element 2 is sealed with the cover 15, and thus, a pressure increases according to the deformation of the lid 16, and the electrode 12 is separated from the insulator 11 in a portion which is approximately in the contact state by the pressure imparting unit 3. A charge generated by separation is output to the signal processor 4 through the electrode 12, and thus, contact in the initial state of the sensor 1 can be detected.

EXAMPLE 1

<Preparation of Element 2>

Silicone rubber (KE-1935, manufactured by Shin-Etsu Chemical Co., Ltd.) was applied onto a polyethylene terephthalate (PET film, was subjected to pre-heating at 60° C. for 5 minutes, was calcined for 1 hour, heated and cured at 120° C. for 10 minutes, and was subjected to rubber molding to have a thickness of approximately 100 um, and thus, rubber cut to have a size of 20 cm×15 cm was prepared. Further, the rubber was subjected to surface modification treatment, and the PET film was peeled off, and thus, an insulator was configured. Plasma treatment was performed in the following condition (Treatment Condition, PR-510, manufactured by Yamato Scientific Co., Ltd., output of 300 W, a treatment time of 3 minutes, Reaction Atmosphere: Oxygen) as the surface modification treatment. A cloth electrode Sui-10-70 having a thickness of 110 µm (manufactured by SEIREN Co., Ltd.), which was cut to have a size of 19 cm×14 cm, was used as the electrode 12. The spacer 14 (U34 Lumirror #50, manufactured by TORAY INDUSTRIES, INC., a thickness of 50 µm) was secured between the silicone rubber and the electrode 12 with a double-sided tape (TRAN-SILNT-1001, manufactured by TAIYO WIRE CLOTH CO., LTD, a thickness of 50 µm). The electrode 12 was drawn out and was connected to an oscilloscope (manufactured by Teledyne LeCroy Japan Corporation). A PET laminate film having a thickness of 75 µm (manufactured by FELLOWS Inc.), which was cut to have a size of 22 cm×17 cm, was used as the cover 15 and the lid 16. A pressure of approximately 2 kPa (Area: 144 cm$^2$, Weight: 2.77 kg) was applied to the element 2 in the initial state by the weight, which is the movable body (the pressure imparting unit), and after that, a contact operation was manually performed with respect to a surface other than a pressure imparting portion (the pressure receiver 10).

COMPARATIVE EXAMPLE 1

In the configuration of Example 1, a contact and separation operation was manually performed with respect to the pressure receiver 10 of the element 2 in the initial state, in a state where a pressure was not applied by the weight.

Figure 9:
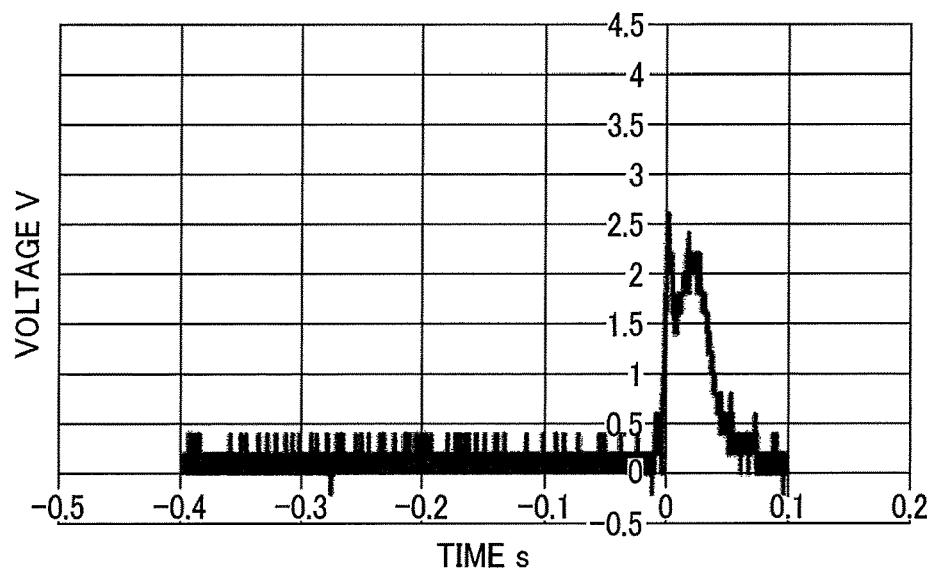
FIG. 9 is a diagram illustrating an output result according to Example 1.
Figure 10:
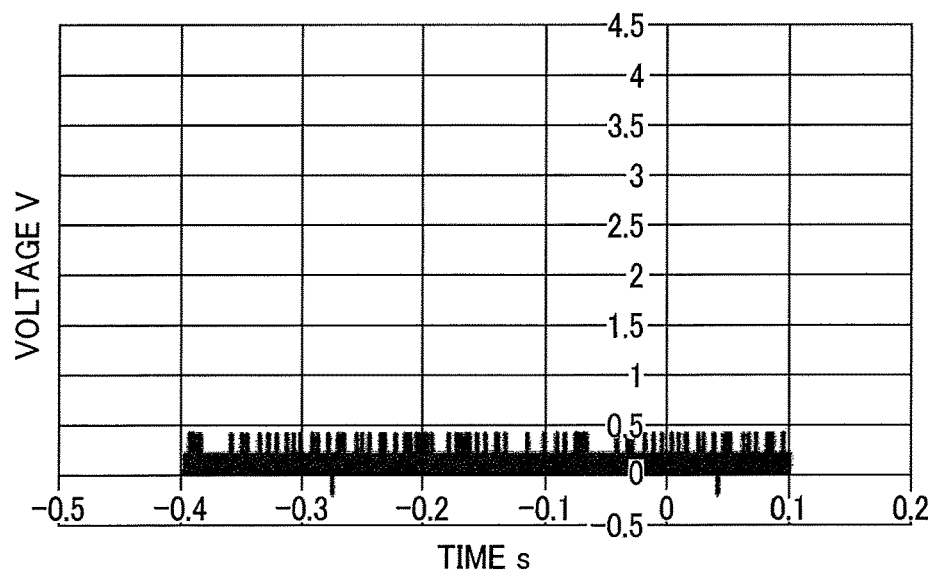
FIG. 10 is a diagram illustrating an output result according to Comparative Example 1.

FIG. 9 illustrates a measurement result of the output from the sensor 1 in a case where a person is in contact with the pressure receiver 10 in Example 1, and FIG. 10 illustrates a measurement result of the output from the sensor in a case where a person is in contact with the pressure receiver 10 in Comparative Example 1. In FIG. 9 and FIG. 10, a vertical axis represents a voltage (V) which is the output, and a horizontal axis represents time (S). In Example 1 of FIG. 9, initial rise of the voltage occurs, and thus, contact is detected, but in Comparative Example 1, the initial rise of the voltage does not occur, and thus, the contact is not capable of being detected. As it is obvious from the results of Example 1 and Comparative Example 1, in the initial state where a charge on the facing surface 11a of the insulator 11 decreases, and the electrode 12 is in contact with a part of the insulator 11 in advance before the detection target is in contact with the sensor 1, and thus, it is possible to detect that the detection target is initially in contact with the sensor 1.

In the case of a configuration where a charge is generated when the electrode is separated from the insulator, flows into the electrode, remains on the front surface of the insulator at the time of performing separation, and flows into the electrode when the electrode is in contact with the insulator, a charge amount on the front surface of the insulator decreases due to a charge leakage or the like on the front surface of the insulator as a time interval from an initial contact operation or a separating operation to the next contact operation (hereinafter, standing time) becomes longer. In such a state, a charge amount flowing into the electrode at the time of performing contact, and thus, there is a room for improvement from the viewpoint of initial rise.

As described above, according to the embodiment of the present disclosure, it is possible to improve initial rise of the output of the sensor.

The embodiment and the example of the present disclosure have been described, but the present disclosure is not limited to such a specific embodiment or an example, and various modification and changes can be performed within the scope of the gist of the present disclosure described in the range of the claims unless otherwise particularly stated in the above description. The effects described in the embodiment of the present disclosure are merely a list of suitable effects obtained from the present disclosure, and the effects of the present disclosure are not limited to those described in the embodiment of the present disclosure.

Numerous additional modifications and variations are possible in light of the above teachings. It is therefore to be understood that, within the scope of the above teachings, the present disclosure may be practiced otherwise than as specifically described herein. With some embodiments having thus been described, it will be obvious that the same may be varied in many ways. Such variations are not to be regarded as a departure from the scope of the present disclosure and appended claims, and all such modifications are intended to be included within the scope of the present disclosure and appended claims.

What is claimed is:

1. A sensor comprising:
   an electrode;
   an insulator disposed at a position facing the electrode and away from the electrode;
   a cover which surrounds the electrode and the insulator, the cover including a lid, the insulator abutting an inner surface of the lid;

a pressure receiver disposed on a first portion of an outer surface of the lid, the pressure receiver being a contact detector and facing the insulator through the lid; and a pressure imparting unit which presses a second portion of the outer surface of the lid so as to press a part of the insulator toward the electrode at a position different from the pressure receiver to contact the insulator with the electrode, the second portion of the outer surface of the lid being different than the first portion of the outer surface of the lid, wherein the insulator generates power by contact charging or separation charging with respect to the electrode, to output the power as a signal.

2. The sensor according to claim 1, wherein a space is disposed between the insulator and the electrode.

3. The sensor according to claim 1, further comprising a spacer to form a space between the insulator and the electrode.

4. The sensor according to claim 1, further comprising:

an element including a lamination of the electrode and the insulator.

5. A sensor system comprising:

the sensor according to claim 1; and a signal processor to process a signal output from the electrode of the sensor.

6. The sensor system according to claim 5, wherein the signal processor controls an operation of the pressure imparting unit in accordance with the signal and a preset determination value.

* * * * *